United States Patent [19]

Shinonaga et al.

[11] Patent Number: 5,838,426
[45] Date of Patent: Nov. 17, 1998

[54] EXPOSURE APPARATUS AND, METHOD WHICH CHANGES WAVELENGTH OF ILLUMINATION LIGHT IN ACCORDANCE WITH PRESSURE CHANGES OCCURRING AROUND PROJECTION OPTICAL SYSTEM

[75] Inventors: Hirohiko Shinonaga; Hiroshi Sato, both of Utsunomiya, Japan

[73] Assignee: Canon Kabushiki Kaisha, Tokyo, Japan

[21] Appl. No.: 643,924

[22] Filed: May 7, 1996

[30] Foreign Application Priority Data

May 9, 1995 [JP] Japan .................................. 7-135894

[51] Int. Cl.$^6$ .......................... G03B 27/68; G03B 27/42; G03B 27/72
[52] U.S. Cl. .................................. 355/52; 355/53; 355/71
[58] Field of Search ................................. 355/52, 53, 67, 355/71; 353/121, 122, 101; 356/399, 400, 401

[56] References Cited

U.S. PATENT DOCUMENTS

| | | | |
|---|---|---|---|
| 4,690,528 | 9/1987 | Tanimoto et al. | 353/101 |
| 4,773,750 | 9/1988 | Bruning | 353/122 |
| 4,805,000 | 2/1989 | Ogawa et al. | 355/43 |
| 4,811,055 | 3/1989 | Hirose | 355/53 |
| 4,905,041 | 2/1990 | Aketagawa | 355/53 |
| 4,907,021 | 3/1990 | Yabu | 353/101 |
| 4,961,001 | 10/1990 | Liegel et al. | 250/491.1 |
| 4,968,868 | 11/1990 | Aketagawa | 219/121.68 |
| 4,974,018 | 11/1990 | Komoriya et al. | 355/53 |
| 4,998,821 | 3/1991 | Ohta et al. | 353/122 |
| 5,025,284 | 6/1991 | Komoriya et al. | 355/53 |
| 5,095,190 | 3/1992 | Aketagawa et al. | 219/121.78 |
| 5,105,075 | 4/1992 | Ohta et al. | 250/201.2 |
| 5,119,390 | 6/1992 | Ohmori | 355/71 |
| 5,163,168 | 11/1992 | Kubota et al. | 356/124.5 |
| 5,373,515 | 12/1994 | Wakabayashi et al. | 372/20 |
| 5,563,411 | 10/1996 | Kawata et al. | 250/306 |
| 5,596,204 | 1/1997 | Irie et al. | 250/548 |

FOREIGN PATENT DOCUMENTS

| | | |
|---|---|---|
| 0302124 | 2/1989 | European Pat. Off. . |
| 62-32613 | 2/1987 | Japan . |
| 63-32613 | 2/1988 | Japan . |
| 63-302519 | 12/1988 | Japan . |
| 4-30411 | 2/1992 | Japan . |
| 4-30412 | 2/1992 | Japan . |

OTHER PUBLICATIONS

Patent Abstracts of Japan vol. 012, No. 261 (E–636), published Jul. 22, 1988, English Abstract of Japanese Pat. No. 63–045875.

Patent Abstract of Japan vol. 013, No. 139 (E–738), published Apr. 6, 1989, English Abstract of Japanese Pat. No. 63–302519.

*Primary Examiner*—R. L. Moses
*Assistant Examiner*—Shival Virmani
*Attorney, Agent, or Firm*—Fitzpatrick, Cella, Harper & Scinto

[57] ABSTRACT

A projection exposure apparatus including structure for supplying illumination light, using a projection optical system for projecting a pattern of a first object onto a second object in cooperation with the illumination light, the projection optical system having a refraction optical element, controlling a changing unit (for changing a wavelength of illumination light) on the basis of an output of a detecting unit (for detecting a change in pressure around the projection optical system) so as to compensate a change in ratio, or so as to maintain a constant ratio, of reflective index between an atmosphere and the refraction optical element due to a change in pressure, and correcting a change in optical characteristic of the projection optical system, due to a factor other than the pressure change, without use of the wavelength changing unit; and a device manufacturing method including a step of projecting and transferring a device pattern of a mask onto a substrate by using the projection exposure apparatus.

28 Claims, 6 Drawing Sheets

EXPOSURE APPARATUS AND, METHOD WHICH CHANGES WAVELENGTH OF ILLUMINATION LIGHT IN ACCORDANCE WITH PRESSURE CHANGES OCCURRING AROUND PROJECTION OPTICAL SYSTEM

FIELD OF THE INVENTION AND RELATED ART

This invention relates to a projection exposure apparatus and a device manufacturing method. More particularly, the present invention is concerned with a projection exposure apparatus and a device manufacturing method which is particularly suitably applicable for manufacture of a semiconductor device such as an IC or LSI, an image pickup device such as a CCD or a display device such as a liquid panel, wherein, in projection of an electronic circuit pattern of a reticle onto a surface of a wafer, the optical performance such as focus position, spherical aberration, comma, astigmatism or projection magnification error which is changeable with a change in environment, is corrected satisfactorily, whereby a high precision projected pattern image is produced.

Integration of a semiconductor device such as an IC or LSI has increased to meet the demand of higher integration, and many improvements have been made in a reduction projection exposure apparatus of step-and-repeat type or step-and-scan type wherein an image of a circuit pattern of a mask (or reticle) is formed on a photosensitive substrate by a projection optical system by which the photosensitive substrate is exposed.

The optical performance such as imaging magnification or imaging performance of a projection optical system for projecting a pattern of a reticle onto the surface of a wafer in a reduced scale, is changeable with a change in environment such as pressure. In a projection exposure apparatus which should satisfy a high resolving power, an error in optical performance resulting from a change in pressure raises a large problem. It is very important to correct such an error in the optical performance.

Japanese Laid-Open Patent Application, Laid-Open No. 30411/1992, filed in Japan under the name of the assignee of the subject application, proposes a projection exposure apparatus for projecting a pattern of a first object illuminated with light from an illumination system onto a second object through a projection optical system, wherein the apparatus is provided with driving means for displacing at least one lens system of the projection optical system along the direction of an optical axis or for relatively displacing the projection optical system and the first object relative to each other, and wavelength changing means for changing the emission wavelength of light from the illumination system, by which projection magnification and distortion in the projection of the pattern of the first object onto the second object through the projection optical system are adjusted.

Japanese Laid-Open Patent Application, Laid-Open No. 30412/1992 proposes a projection exposure apparatus for projecting a pattern of a first object illuminated with light from an illumination system onto a second object through a projection optical system, wherein the apparatus is provided with pressure adjusting means for isolating at least one space within the lens stem of the projection optical system and for adjusting the pressure in that space or the component of a gas in that space, and wavelength changing means for changing the emission wavelength of light from the illumination system, by which projection magnification and distortion in the projection of the pattern of the first object onto the second object through the projection optical system is adjusted.

Among errors of optical performance of a projection optical system, an error in projection magnification and an error of aberration of distortion appear as a difference between a desired grid point and a grid point of a projected pattern. It produces a large effect upon matching precision in registration of a reticle having an electronic circuit pattern and a wafer.

In order to meet further miniaturization and further increase of integration, a projection optical system of recent projection exposure apparatuses has an increasing numerical aperture (N.A.) or an increasing range of projection exposure (i.e., view field size). As an example, a projection optical system having N.A. of about 0.6 and a field size of 22 mm square, is used. When such a projection optical system having a large N.A. and a large field size is used, a change in optical performance resulting from a change in environment such as pressure causes non-negligible amount of change in projection magnification and distortion, and additionally, in spherical aberration, comma, astigmatism and curvature of field.

Generally, the amount of change in aberration of a projection optical system resulting from a pressure change increases in accordance with the N.A. and the view angle. For example, in a case of a projection optical system having a N.A. of 0.6 and a field size of 22 mm square, the amount of change in aberration due to a pressure change becomes large, and this produces a large influence to the imaging performance of a projection exposure apparatus which is currently to be used for projection of a circuit pattern of half micron size or less.

Additionally, there is a pressure difference due to a difference in level (land level) between the location where adjustment of a projection exposure apparatus is performed and the location where the apparatus is used. Such pressure difference may be 11.4 Hpa per a level difference of 100 m. It causes a change in refractivity of air between lenses, such that the actual imaging state becomes different from a desired state. Thus, there is a problem that, depending on the location where a projection exposure apparatus is installed, desired imaging performance is not attainable.

In order to solve this problem, conventionally, an error of optical performance to be caused by a pressure difference is estimated beforehand while taking into account the land level (i.e., pressure) of the location where a projection exposure apparatus is to be installed, and a projection optical system is adjusted beforehand during the assembling so that desired optical performance is provided after the projection exposure apparatus is installed.

With this process, however, it is necessary to set and adjust particular offsets of various optical performances, from a normal state, in accordance with locations where a projection optical system is to be used. It needs complicated control and adjustment. Also, there is a problem that the performance check in the state under operation cannot be performed at the location where assembling and adjustment is performed.

Japanese Laid-Open Patent Application, Laid-Open No. 302519/1988 filed in Japan under the name of the assignee of the subject application proposes a projection exposure apparatus by which the problem described above may be solved. However, it is still desirable to provide a projection exposure apparatus by which a change in optical performance due to a change in pressure is corrected with higher precision.

SUMMARY OF THE INVENTION

It is an object of the present invention to provide a projection exposure apparatus for projecting a pattern of a first object such as a reticle onto a second object such as a wafer through a projection optical system, wherein a change in optical performance due to a pressure change or a difference in pressure at the location where the apparatus is installed can be corrected easily and satisfactorily such that high optical performance can be maintained.

In accordance with an aspect of the present invention, there is provided a projection exposure apparatus, comprising: illumination means for supplying illumination light; a projection optical system for projecting a pattern of a first object onto a second object in cooperation with the illumination light, said projection optical system having a refraction optical element; changing means for changing a wavelength of the illumination light; detecting means for detecting a change in pressure; and control means for controlling said changing means on the basis of an output of said detecting means so as to compensate a change in ratio of refractivity between an atmosphere and said refraction optical element due to a change in pressure.

In accordance with another aspect of the present invention, there is provided a projection exposure apparatus, comprising: illumination means for supplying illumination light; a projection optical system for projecting a pattern of a first object onto a second object in cooperation with the illumination light, said projection optical system having a refraction optical element; changing means for changing a wavelength of the illumination light; detecting means for detecting a change in pressure; and control means for controlling said changing means on the basis of an output of said detecting means so as to maintain a constant ratio of refractivity between an atmosphere and said refraction optical element irrespective of a change in pressure.

In these aspects of the present invention, said illumination means may supply laser light as said illumination light.

The laser light may comprise deep ultraviolet light and said projection optical system may include a lens made of $SiO_2$.

Said projection optical system may include a lens made of $CaF_2$.

Said illumination means may include an excimer laser light, which produces the laser, wherein said excimer laser may have a resonator with a mirror and a wavelength selecting element, and said changing means may include actuating means for changing one of said wavelength selecting element of said resonator and tilt of said mirror of said resonator.

Said wavelength selecting element may comprise an etalon.

Said wavelength selecting element may comprise a diffraction grating.

Said wavelength selecting element may comprise a prism.

Said excimer laser may comprise a KrF laser.

Said apparatus may further comprise driving means for moving the first object in a direction of an optical axis of said projection optical system, and a position detector for detecting the position of the first object with respect to the direction of the optical axis.

Said apparatus may further comprise driving means for moving a lens of said projection optical system in a direction of an optical axis of said projection optical system, and a position detector for detecting the position of a surface of said lens with respect to the direction of the optical axis.

Said apparatus may further comprise driving means for moving the second object in a direction of an optical axis of said projection optical system, and a position detector for detecting the position of a surface of the second object with respect to the direction of the optical axis.

Said apparatus may further comprise actuating means for changing a pressure in a space between lenses of said projection optical system, and a pressure detector for detecting a pressure in said space.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
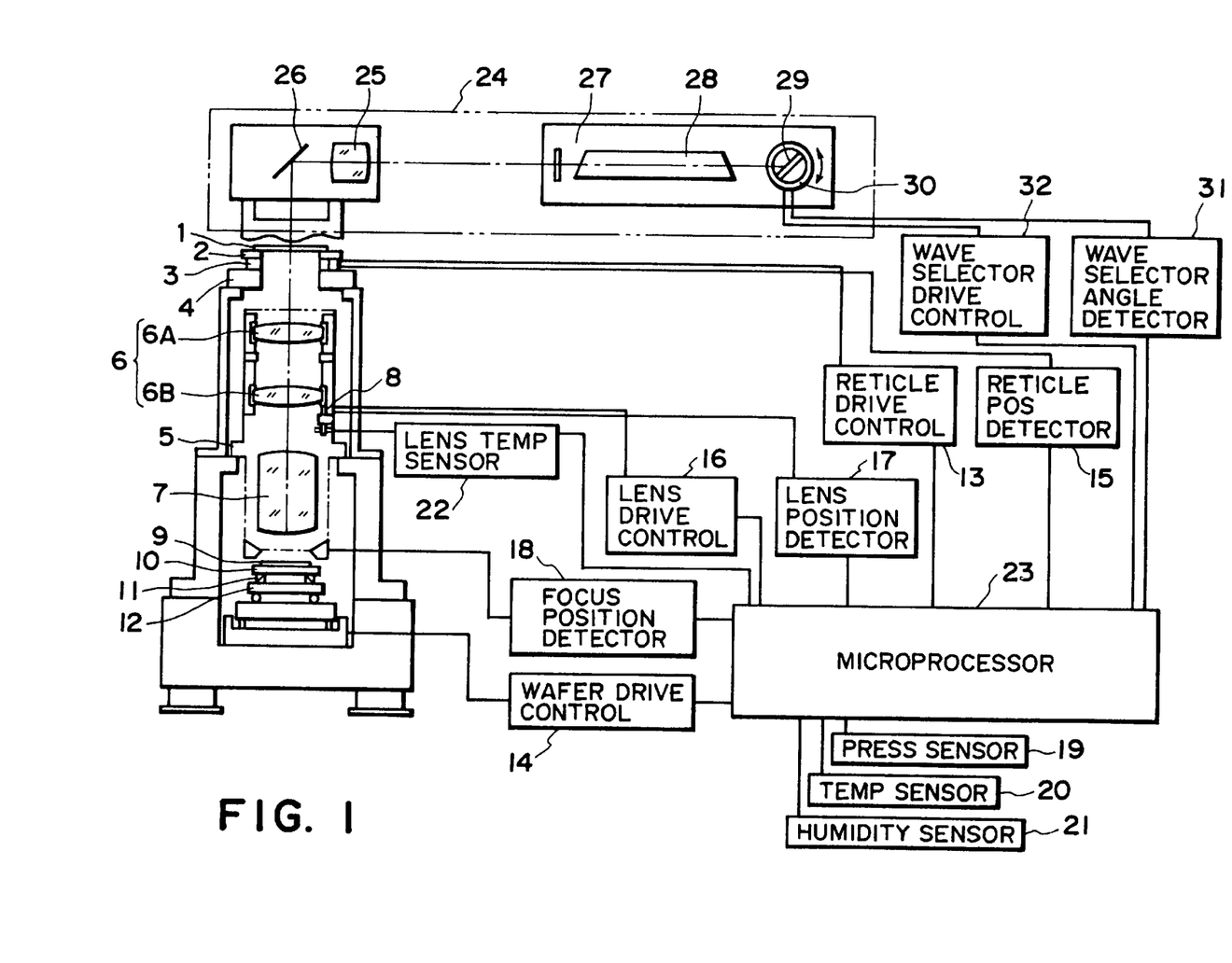
FIG. 1 is a schematic and diagrammatic view of a main portion of a projection exposure apparatus according to a first embodiment of the present invention.

FIG. 1 shows a projection exposure apparatus according to a first embodiment of the present invention. In this embodiment, the apparatus is provided with an adjusting mechanism for adjusting a change in optical performance of a projection optical system due to a change in pressure. This adjusting mechanism comprises pressure measuring means for measuring a pressure, and wavelength changing means for changing the emission wavelength of light from an illumination system in accordance with a signal from the pressure measuring means, to thereby adjust the optical performance for projection of a pattern of a first object onto a second object through the projection optical system.

As an alternative, the apparatus may be provided with a mechanism for displacing a portion of the lens system of the projection optical system along the optical axis. Alternatively or additionally, the apparatus may be provided with a mechanism for relatively displacing the projection optical system and the first object surface relative to each other in the direction of the optical axis.

Particularly, in accordance with the present invention, the optical performance such as focus position, projection magnification, spherical aberration, comma, astigmatism, curvature of field or distortion, can be corrected satisfactorily.

In FIG. 1, denoted at 1 is a reticle (first object) on which a circuit pattern is formed. Denoted at 2 is a reticle chuck for attracting and supporting the reticle 1, and denoted at 3 is a reticle driving means mounted on the reticle chuck. Denoted at 4 is a reticle stage for supporting the reticle driving means 3, and denoted at 5 is a projection lens system (projection optical system) of reduction type. Denoted at 6A and 6B are field lenses of portion lens systems which constitute the projection lens system 5.

Denoted at 7 is a lens system which is made of a single glass material, which lens system is a component of the projection lens system 5. Denoted at 8 is a lens actuating means for displacing the field lens 6A in the direction of an optical axis AX of the projection lens system 5. Denoted at 9 is a wafer (second object) which is coated with a photosensitive material such as a resist. Denoted at 10 is a wafer chuck for attracting and holding the wafer 9, and denoted at 11 is a wafer driving means mounted on the wafer chuck 10.

The reticle driving means 3 and the wafer driving means 11 each may comprise a piezoelectric device, for example. The reticle driving means 3 operates to move the reticle chuck 2 in the optical axis AX direction of the projection lens system 5 to thereby displace the reticle 1 in the optical axis AX direction. The wafer driving means 11 operates to move the wafer chuck 10 in the optical axis AX direction of the projection lens system 5 to thereby displace the wafer 9 in the optical axis AX direction. Denoted at 12 is a wafer stage for supporting the wafer driving means 11, which is movable along a plane perpendicular to the optical axis AX of the projection optical system 5.

On the other hand, the lens actuating means 8 operates to displace the field lens 6A in the optical axis AX direction of the projection lens system 5 by using an air pressure or a piezoelectric device, for example. Japanese Laid-Open Patent Application, Laid-Open No. 32613/1987 shows an arrangement which is usable as the lens actuating means 8 of this embodiment. Thus, detailed description of the lens actuating means is omitted here.

Drive of the reticle chuck 2 by the reticle driving means 3 is performed in accordance with a signal from a reticle drive control system 13, and the position of the reticle 1 in the optical axis AX direction is detected by means of a reticle position detector 15. Similarly, drive of the field lens 6A by the lens actuating means 8 is performed in accordance with a signal from a lens drive control system 16, and the position of the field lens 6A in the optical axis AX direction is detected by means of a lens position detector 17. The reticle position detector 15 and the lens position detector 17 each may comprise a position detector such as an optical encoder, for example.

Drive of the wafer chuck 10 by the wafer driving means 11 is performed in accordance with a signal from a wafer drive control system 14, and the position of the wafer 9 (its surface) is detected by a focus detector 18. The focus detector 18 may comprise a conventional structure used in this type of projection exposure apparatus, and it may include an air sensor or an optical sensor, for example. Signals from the reticle position detector 15, from the lens position detector 17 and from the focus position detector 18, are applied to a microprocessor 23.

On the other hand, the apparatus is equipped with a pressure sensor (pressure measuring means) 19, a temperature sensor 20 and a humidity sensor 21 for respectively detecting a change in pressure, temperature and humidity around the projection lens system 5. Additionally, there is a lens temperature sensor 22 for detecting a change in temperature, resulting from absorption of light by the projection lens system 5. Signal from these sensors 19, 20, 21 and 22 are applied to the microprocessor 23. Also, the reticle drive control system 13, the lens drive control system 16 and the wafer drive control system 14 are all controlled by means of the microprocessor 23. Of the elements described above, those denoted at 13, 14, 15, 16 and 17 are components of driving means.

Denoted at 24 is an illumination system for illuminating the circuit pattern of the reticle 1 with uniform illuminance. The illumination system 24 includes a KrF excimer laser (as exposure light source) for emitting laser light of emission wavelength $\lambda=248.4$ nm and half width of about 0.003 nm. Laser light from the illumination system 24 is directed to the reticle 1 and to the wafer 9 through the projection lens system 5, by which an image of the circuit pattern of the reticle 1 is projected on the wafer 9 in a reduced scale.

In this embodiment, the projection exposure process is performed by using laser light having a wavelength in deep ultraviolet region. For this reason, all the lenses of the projection lens system 5 are made of fuses silica ($SiO_2$) having a high transmissivity to light of a wavelength $\lambda=248.4$ nm.

Now, the components of the illumination system 24 of this embodiment will be explained. Denoted at 27 is a laser light source which produces light whose emission wavelength is controlled by means of a wavelength selector actuation control system 32 to be described later. Denoted at 25 is a condenser lens for illuminating the reticle 1 surface uniformly with light from the laser light source 27, in cooperation with reflection by a mirror 26.

The laser light source 27 comprises a laser resonator 28 and a wavelength selecting element 29. Denoted at 30 is a wavelength selector driving means, and denoted at 31 is a detector for detecting the angle of the wavelength selecting element. Denoted at 32 is a wavelength selector actuation control system. These elements are components of wavelength changing means.

Figure 2A:
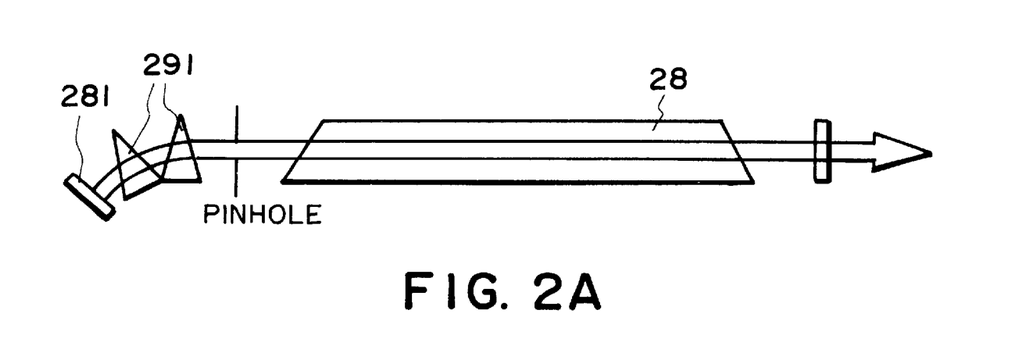
FIGS. 2A–2C are schematic views of lasers usable in the first embodiment of FIG. 1.
Figure 2B:
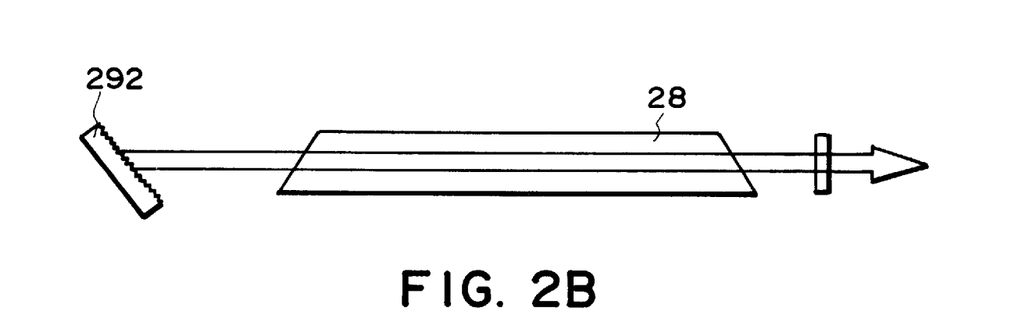
Figure 2C:
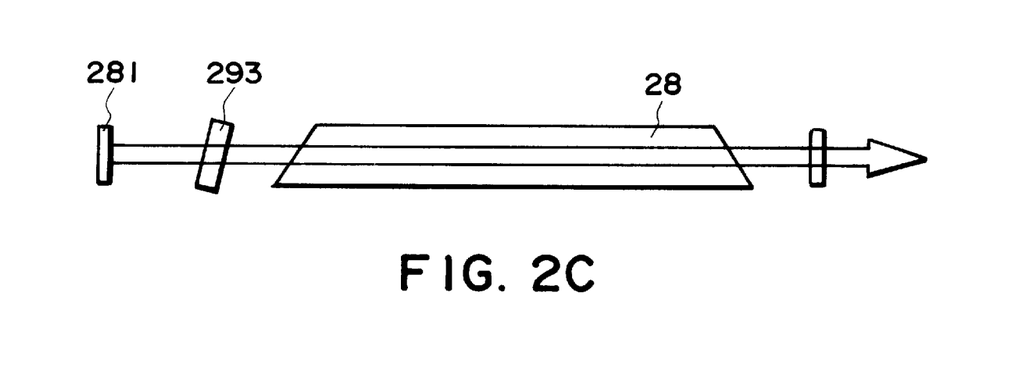

FIGS. 2A–2C show three examples of a main portion of the laser light source 27 of FIG. 1. The wavelength selecting element 29 may comprise a prism 291 (FIG. 2A), a grating 292 (FIG. 2B) or an etalon 293 (FIG. 2C), by which the bandwidth of light can be narrowed. By changing simultaneously the angle of a reflection mirror 281 behind the prism 291 (FIG. 2A), or by changing the angle of the grating 292 (FIG. 2B), or by changing the angle of the etalon 281 (FIG. 2C), it is possible to change the wavelength of light within the range of the inherent wavelength band of the laser resonator 28.

The wavelength selecting element 30 may comprise a step motor or a piezoelectric device, for example. The wavelength selecting element is actuated in response to a signal from the wavelength selector actuation control system 32. Here, the angle of the wavelength selecting element 29 is detected by the wavelength selector angle detector 31. This angle detector may comprise one of various angle detectors, such as an optical encoder, for example. The signal from the wavelength selector angle detector 31 is applied to the microprocessor 23. Also, the wavelength selector actuation control system 32 is controlled by means of the microprocessor 23.

For more exact control of the wavelength, a portion of laser light from the laser light source 27 may be introduced into a wavelength detector, and the angle of the wavelength selecting element 29 may be controlled in accordance with the detection of the wavelength by that detector.

Figure 3:
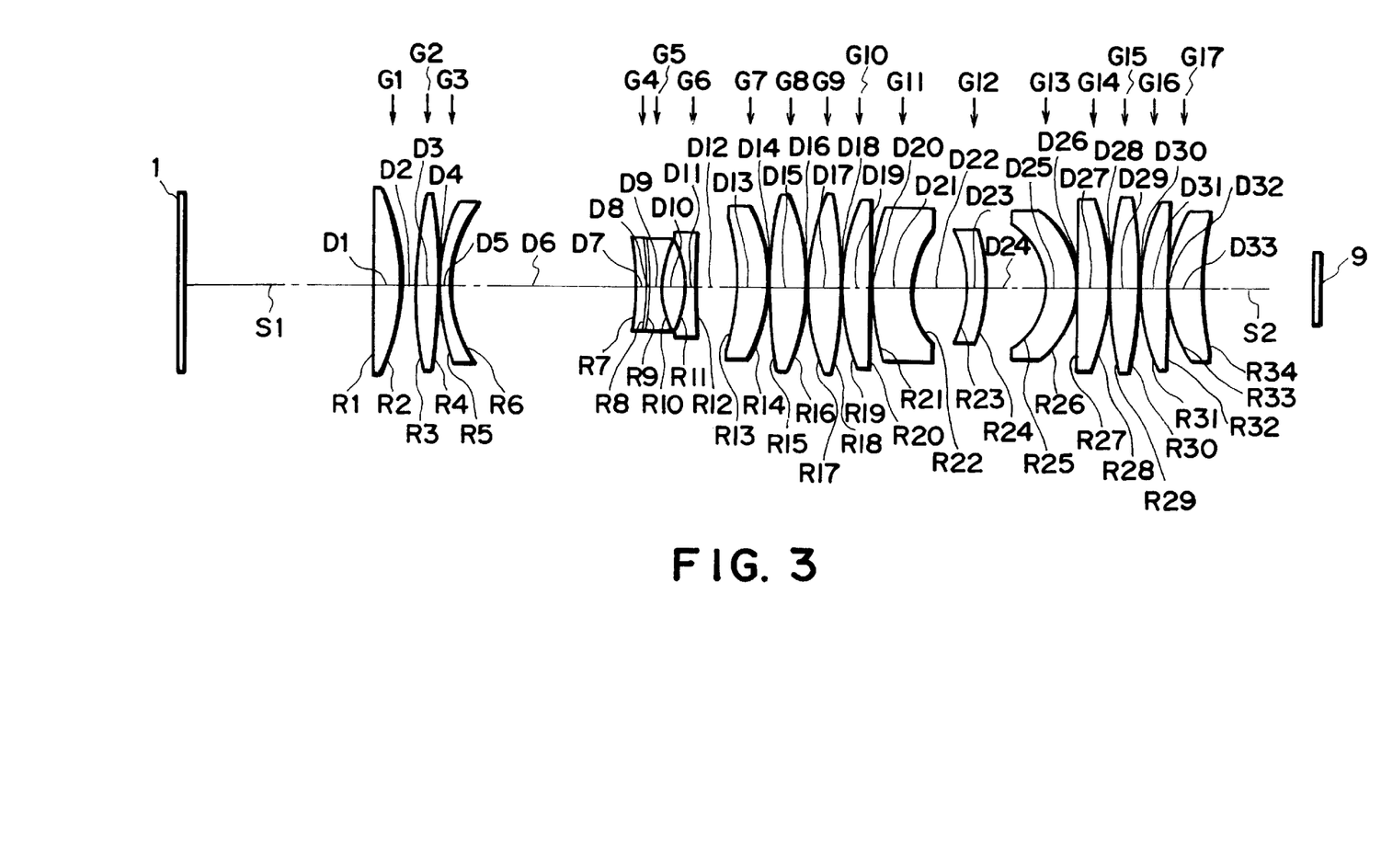
FIG. 3 is a sectional view of lenses of a projection lens system of the FIG. 1 embodiment.

FIG. 3 is a sectional view of a specific lens arrangement of the projection lens system 5 of the FIG. 1 embodiment. In FIG. 3, seventeen (17) lenses denoted at G1–G17, respectively, are disposed along the optical axis AX, between the reticle 1 and the wafer 9, by which the projection lens system 5 is provided.

Tale 1 below shows the lens data of the projection lens system of FIG. 3. In this table, Ri (i=1 to 34) is the curvature radius (mm) of the i-th lens surface in the order from the reticle 1 side, and Di is the on-axis thickness or on-axis air spacing (mm) between the i-th lens surface and (i+1)-th lens surface in the order from the reticle 1 side. Ni (i=1 to 17) is the refractivity of the lens Gi (i=1 to 17). S1 is the on-axis air spacing between the circuit pattern surface of the reticle 1 and the lens surface of the lens G1 at the reticle 1 side. S2 is the on-axis air spacing between the wafer 9 surface and the lens surface of the lens G17 at the wafer 9 side.

The projection lens system 5 of this embodiment has a N.A. of 0.45 and a field size of 17 mm square.

TABLE 1

|     |      |            |      |            |      |         |
|-----|------|------------|------|------------|------|---------|
|     |      |            | S1:  | 120.00000  |      |         |
| G1  | R1:  | 4288.31660 | D1:  | 20.00000   | N1:  | 1.50841 |
|     | R2:  | -194.67943 | D2:  | 12.50000   |      |         |
| G2  | R3:  | 316.51971  | D3:  | 17.65000   | N2:  | 1.50841 |
|     | R4:  | -645.60624 | D4:  | 0.65000    |      |         |
| G3  | R5:  | 159.56222  | D5:  | 9.00000    | N3:  | 1.50841 |
|     | R6:  | 106.44033  | D6:  | 144.25282  |      |         |
| G4  | R7:  | -262.91712 | D7:  | 9.60000    | N4:  | 1.50841 |
|     | R8:  | -283.21210 | D8:  | 1.93700    |      |         |
| G5  | R9:  | -261.37159 | D9:  | 8.00000    | N5:  | 1.50841 |
|     | R10: | 75.51789   | D10: | 19.25000   |      |         |
| G6  | R11: | -85.44995  | D11: | 8.00000    | N6:  | 1.50841 |
|     | R12: | 478.74733  | D12: | 31.80619   |      |         |
| G7  | R13: | -212.80570 | D13: | 25.77500   | N7:  | 1.50841 |
|     | R14: | -140.88403 | D14: | 1.00000    |      |         |
| G8  | R15: | 476.10689  | D15: | 28.80000   | N8:  | 1.50841 |
|     | R16: | -175.80636 | D16: | 1.20000    |      |         |
| G9  | R17: | 191.89002  | D17: | 26.50000   | N9:  | 1.50841 |
|     | R18: | -376.32283 | D18: | 1.00000    |      |         |
| G10 | R19: | 195.90907  | D19: | 20.00000   | N10: | 1.50841 |
|     | R20: | 728.48554  | D20: | 2.00000    |      |         |
| G11 | R21: | 199.33045  | D21: | 29.77500   | N11: | 1.50841 |
|     | R22: | 73.28895   | D22: | 44.25251   |      |         |
| G12 | R23: | -97.77667  | D23: | 14.40000   | N12: | 1.50841 |
|     | R24: | -167.01740 | D24: | 47.13922   |      |         |
| G13 | R25: | -60.87811  | D25: | 24.00000   | N13: | 1.50841 |
|     | R26: | -74.57920  | D26: | 1.20000    |      |         |
| G14 | R27: | -1642.28154| D27: | 23.00000   | N14: | 1.50841 |
|     | R28: | -229.79037 | D28: | 1.20000    |      |         |
| G15 | R29: | 310.70111  | D29: | 23.00000   | N15: | 1.50841 |
|     | R30: | -498.20086 | D30: | 1.20000    |      |         |
| G16 | R31: | 152.70093  | D31: | 22.20000   | N16: | 1.50841 |
|     | R32: | 2145.05915 | D32: | 1.20000    |      |         |
| G17 | R33: | 118.62840  | D33: | 24.00000   | N17: | 1.50841 |
|     | R34: | 205.54691  | S2:  | 88.74807   |      |         |

In this example, it is assumed that a pressure change of 30 hpa, for example, produces a shift of quantity $\Delta f$ due to a change in focus position of an image point of the projection lens (hereinafter "focus position change $\Delta f$"), a shift of quantity $\Delta SA$ due to a change in spherical aberration (hereinafter "spherical aberration change $\Delta SA$"), a shift of quantity $\Delta CM$ due to a change in comma aberration of an image point at an image height position 12 mm on the image plane (hereinafter "comma change $\Delta CM$"), a shift of quantity $\Delta AS$ due to a change in astigmatism (hereinafter "astigmatism change $\Delta AS$"), a shift of quantity $\Delta M$ due to a change in curvature of image surface in meridional direction (hereinafter "meridional image surface curvature change $\Delta M$"), a shift of quantity $\Delta S$ due to a change in curvature of image surface in sagittal direction (hereinafter "sagittal image surface curvature change $\Delta S$"), and a shift of quantity $\Delta Y$ due to a change in symmetric distortion and in projection magnification (i.e., the amount of displacement of the image height at an image height 12 mm) (hereinafter "symmetrical distortion and projection magnification change $\Delta Y$).

Under this condition, the changes in these optical performances are as follows:

Focus position change $\Delta f$=5.05 micron

Spherical aberration change $\Delta SA$=0.286$\lambda$

Comma change $\Delta CM$=0.120$\lambda$

Astigmatism change $\Delta AS$=16 nm

Meridional image surface curvature change $\Delta M$=49 nm

Sagittal image surface curvature change $\Delta S$=16 nm

Symmetric distortion and projection magnification change $\Delta Y$=140 nm

In this embodiment, if a pressure change such as described above occurs, the optical performances of the projection lens are corrected in the following manner.

That is, while the optical performances of the projection optical system 5 change with a change in pressure, the wavelength changing means serves to change the emission wavelength $\lambda$ of the illumination system 24 as a variable, to thereby adjust the optical performances of the projection optical system 5 such as focus position, projection magnification, spherical aberration, comma, astigmatism, image surface curvature or distortion. The principle of adjustment will be explained below.

It is now assumed that the pressure is a variable X and a change thereof is $\Delta X$. In this case, the focus position change $\Delta f$, the spherical aberration change $\Delta SA$, the comma change $\Delta CM$, the astigmatism change $\Delta AS$, the meridional image surface curvature change $\Delta M$, the sagittal image surface curvature change $\Delta S$ and the symmetric distortion and projection magnification change $\Delta Y$ of the projection lens system of FIG. 1 can be expressed by the following equations:

$$\left.\begin{array}{l}\Delta f = \Delta f_X(\Delta X)\\ \Delta SA = \Delta SA_X(\Delta X)\\ \Delta CM = \Delta CM_X(\Delta X)\\ \Delta AS = \Delta AS_X(\Delta X)\\ \Delta M = \Delta M_X(\Delta X)\\ \Delta S = \Delta S_X(\Delta X)\\ \Delta Y = \Delta Y_X(\Delta X)\end{array}\right\} \quad (1)$$

wherein $\Delta f_X$, $\Delta SA_X$, $\Delta CM_X$, $\Delta AS_X$, $\Delta M_X$, $\Delta S_X$ and $\Delta Y_X$ are functions, taking $\Delta X$ as a variable, as determined by a change of relative refractivity (ratio of refractivity) between the lens and the air, calculated from $\Delta X$.

It is also assumed that the emission wavelength $\lambda$ is a variable and a change thereof is $\Delta\lambda$. Similarly to the equations (1), the focus position change $\Delta f$, the spherical aberration change $\Delta SA$, the comma change $\Delta CM$, the astigmatism change $\Delta AS$, the meridional image surface curvature change $\Delta M$, the sagittal image surface curvature change $\Delta S$, and the symmetric distortion and projection magnification change $\Delta Y$ of the lens system 1 of FIG. 1, can be expressed by the following equations:

$$\left.\begin{array}{l}\Delta f = \Delta f_\lambda(\Delta\lambda)\\ \Delta SA = \Delta SA_\lambda(\Delta\lambda)\\ \Delta CM = \Delta CM_\lambda(\Delta\lambda)\\ \Delta AS = \Delta AS_\lambda(\Delta\lambda)\\ \Delta M = \Delta M_\lambda(\Delta\lambda)\\ \Delta S = \Delta S_\lambda(\Delta\lambda)\\ \Delta Y = \Delta Y_\lambda(\Delta\lambda)\end{array}\right\} \quad (2)$$

wherein $\Delta f_\lambda$, $\Delta SA_\lambda$, $\Delta CM_\lambda$, $\Delta AS_\lambda$, $\Delta M_\lambda$, $\Delta S_\lambda$, and $\Delta Y_\lambda$ are functions, taking $\Delta\lambda$ as a variable, as calculated by changing the relative refractivity between the lens and the air with $\Delta\lambda$.

From the above, the change $\Delta\lambda'$ of wavelength necessary for correcting the focus position, spherical aberration, comma, astigmatism, distortion and projection magnification as the pressure changes by $\Delta X$, is given in accordance with equations (1) and (2), as follows:

$\Delta\lambda' = \Delta f_\lambda^{-1}\{\Delta f_X(\Delta X)\}$ $\Delta\lambda' = \Delta SA_\lambda^{-1}\{\Delta SA_X(\Delta X)\}$ $\Delta\lambda' = \Delta CM_\lambda^{-1}\{\Delta CM_X(\Delta X)\}$ $$\Delta\lambda' = \Delta AS_\lambda^{-1}\{\Delta AS_X(\Delta X)\}$$

$$\Delta\lambda' = \Delta M_{80}^{-1}\{\Delta M_X(\Delta X)\}$$

$$\Delta\lambda' = \Delta S_\lambda^{-1}\{\Delta S_X(\Delta X)\}$$

$$\Delta\lambda' = \Delta Y_\lambda^{-1}\{\Delta Y_X(\Delta X)\} \quad (3)$$

In equation (3), since $\Delta f_X$, $\Delta SA_X$, $\Delta CM_X$, $\Delta AS_X$, $\Delta M_X$, $\Delta S_X$ and $\Delta Y_X$ of equation (1) and $\Delta f_\lambda$, $\Delta SA_\lambda$, $\Delta CM_\lambda$, $\Delta AS_{80}$, $\Delta M_\lambda$, $\Delta S_\lambda$ of equation (2) are all functions as determined by the relative refractivity of the lens and the air, the value $\Delta\lambda'$ as calculated here is the one for correcting the change in relative refractivity (i.e., error in ratio of refractivity) caused by the change in pressure.

In summary, the value $\Delta\lambda'$ is the amount effective to move the relative refractivity (refractivity ratio) back to its reference value. Thus, it can be determined definitely, and the focus position, spherical aberration, comma, astigmatism, image surface curvature, distortion and projection magnification can be corrected simultaneously.

Next, the manner of correcting the focus position error, spherical aberration error, comma error, astigmatism error, image surface curvature error, distortion error and projection magnification error, in projection of the pattern of the reticle 1 onto the wafer 9 surface within the projection exposure apparatus of FIG. 1, will be explained.

The microprocessor 23 has stored in its memory a calculation program for calculating the amount of change in relative refractivity of the air between lenses of the projection lens system 5 in accordance with a measured value of ambient pressure as measured by the pressure sensor 19. In respective calculation formulae, a change in pressure from a predetermined reference value is taken as a variable.

Additionally, the above-described equation (3) is stored in the same memory. Thus, by substituting the amount $\Delta X$ of change of pressure from the reference value into equation (3), the quantity $\Delta\lambda'$ of change by which the variable should be changed is determined. It is to be noted that the equation for determining the value $\Delta\lambda'$ on the basis of a pressure change can be provided in accordance with simulation.

On the other hand, a signal corresponding to the set state of the variable $\lambda$ from the wavelength selector angle detector 31 which is a detector for the wavelength $\lambda$, is applied to the microprocessor 23. In response, the microprocessor 23 produces a signal, corresponding to the quantity $\Delta\lambda'$ by which the variable $\lambda$ should by changed, and applies it to the wavelength selector drive control system 32. Then, the control system 32 supplies a predetermined control signal to the wavelength selector drive control 30, by which actuation for changing the variable $\lambda$ by the amount $\Delta\lambda'$ is performed. By this actuation for the variable $\Delta\lambda'$, the focus position error, spherical aberration error, comma error, astigmatism error, image surface distortion error, distortion error and projection magnification error, of the pattern image resulting from a change in ambient pressure of the projection lens system 5, are corrected.

In this embodiment, first the assembling and adjustment operation is performed so as to assure optimal image performance with respect to a reference wavelength of exposure light to be used and to a particular reference pressure at the location where the assembling and adjustment operation is performed. After shipment and after the exposure apparatus is installed at a location where the apparatus is to be used, the exposure wavelength is changed to set a reference wavelength in connection with that location, on the basis of a difference in pressure corresponding to the difference in land level between there and the location where the assembling and adjustment was performed.

In order to meet daily pressure changes, every time wafers to be processed are loaded into the projection exposure apparatus, the pressure measurement is performed. On the basis of the result of measurement, the wavelength for projection exposure process is adjusted and the exposure process is performed with the adjusted wavelength. This assures good image performance of the projection optical system constantly, irrespective of daily change in pressure.

In addition to the above and independently of the above-described mechanism, the projection exposure apparatus of this embodiment is equipped with an adjusting mechanism for correcting a difference in magnification between different processes, or for correcting an error in magnification between different apparatuses in a case where different processes are performed by using different apparatuses.

The adjusting mechanism for projection magnification comprises a driving mechanism (reticle driving means 3 or lens driving means 8) shown in FIG. 1 which serves to move the reticle 1 or the field lens 6 within the projection lens system 5.

In that case, the field lens 6 of FIG. 1 is not necessarily limited to single. Plural lenses may be used. The reason for that a correcting mechanism for projection exposure magnification is provided in addition to the function of correcting image performance to pressure change, is to correct a difference in magnification between different processes or to correct a projection magnification error between different exposure apparatuses where different processes are performed by using different apparatuses. As regards the portion of the apparatus whereat the magnification error correcting function is to be installed, such portion in which an appropriate magnification change occurs and which does not apply a large influence to the other aberrations may be selected in accordance with simulation, for example.

The focus position of the pattern image through the projection lens system 5 changes in dependence upon the temperature and humidity around the projection lens system 5 and also upon the temperature of the projection lens system 5. Additionally, it changes with the set state of the correcting means for projection magnification described above.

In consideration of it, in this embodiment, a calculation formula for calculating a change in focus position of the projection lens system 5 due to these variable factors is programmed in the memory of the microprocessor 23 beforehand. Thus, the focus position can be determined exactly in accordance with this calculation formula.

Further, the microprocessor 23 serves to detect the focus position of the pattern image formed by the projection lens system 5, on the basis of signals from the wavelength selector angle detector 31, pressure sensor 19, temperature sensor 20, humidity sensor 21 and lens temperature sensor 22. Also, it serves to control the wafer drive control system 13, on the basis of a signal from the focus position detector 18 corresponding to the position of the wafer 9 surface, so that the wafer 9 is positioned at the focus position. The wafer drive control system 13 applies a predetermined signal to the wafer driving means 11 to cause it to move the wafer 9 in the optical axis AX direction, so that the wafer 9 is placed at the focus position of the pattern image.

With the operations described above, for a change in ambient pressure, the focus position, spherical aberration, comma, astigmatism, image surface curvature, distortion and projection magnification are all corrected to the values having been set with respect to a reference pressure, whereby a good pattern image is produced as desired. Additionally, when the projection magnification of the pattern image is corrected by the above-described magnification adjusting means to the magnification as determined in the preceding process, it is assured that the pattern image to be printed is exactly registered with the pattern having been formed on the wafer during the preceding process.

Figure 4:
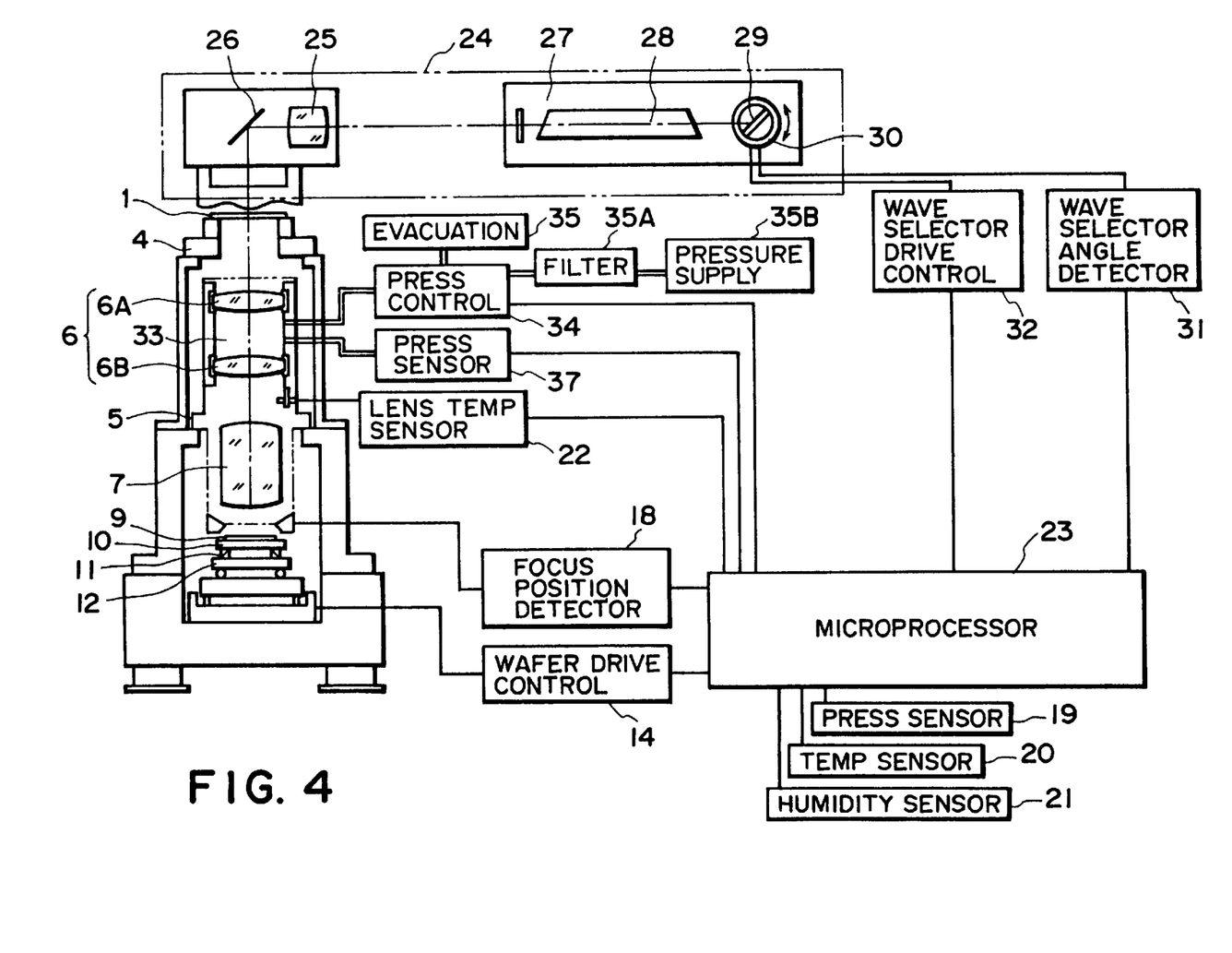
FIG. 4 is a schematic and diagrammatic view of a main portion of a projection exposure apparatus according to a second embodiment of the present invention.

FIG. 4 is a schematic view of a main portion of a projection exposure apparatus according to a second embodiment of the present invention. In this embodiment, as compared with the first embodiment of FIG. 1 wherein the reticle or field lens is displaced, as an adjusting mechanism for adjusting the optical performance of the projection optical system, at least one air or gas space within the lens system of the projection optical system (mainly, the air space between lenses) is isolated from the outside atmosphere, and the pressure within that gas space or the component of gas in that space is adjusted. The remaining portion has substantially the same structure as of the preceding embodiment, and like numerals as those of FIG. 1 are assigned to corresponding elements.

The feature of this embodiment will now be explained, particularly in comparison with the structure of FIG. 1. In FIG. 4, denoted at 33 is a gas space within the lens system which space is isolated from the outside atmosphere. There are a pressure sensor (pressure measuring means) 37 for measuring the pressure (atmospheric pressure) within the space 33 and a pressure controller 34 for controlling the pressure in the space 33, which are connected to the space 33. To the pressure controller 34, a constant pressure is supplied continuously from a pressure supplying device 35B and through a filter 35A. Evacuation means 35 serves to perform pressure discharge as desired. A signal from the pressure sensor 37, detecting the pressure in the space 33, is applied to the microprocessor 23. The elements denoted at 34, 35 and 37 are components of pressure adjusting means.

In this embodiment, as shown in FIG. 4, the adjustment of the optical performance of the projection optical system is performed by providing at least one air space (33) isolated from the outside atmosphere and by controlling the pressure or gas component in that space which is adjusted by means of an adjusting mechanism (pressure controller 34).

In this case, in place of changing the pressure in the space 33 isolated from the outside atmosphere to control the refractivity of air, a gas of $N_2$ or $CO_2$ may be sealingly contained in that space. Alternatively, different gases are mixed and the partial pressure may be controlled.

Further, in the FIG. 4 embodiment, plural spaces isolated from the outside atmosphere may be defined, or plural spaces connected to each other may be defined. Substantially the same advantageous effect is attainable by controlling the pressure in that spaces.

Furthermore, the adjusting means for optical performance may use a combination of the FIG. 1 embodiment and the FIG. 4 embodiment: that is, a combination of the driving means (reticle driving means 3 and the lens driving means 8) of FIG. 1 for moving the reticle or the field lens of the projection lens system 5, with the arrangement of FIG. 4 wherein at least one space isolated from the outside atmosphere is defined in the projection lens system and adjusting means (pressure controller 37) adjusts the pressure or gas component within the space 33. If this combination is adopted, calculation formulae will be somewhat complex, but it will be particularly effective when there is a certain limitation to the amount of drive (variation).

In the embodiments of the present invention described above, lenses of the projection optical system are made of a single glass material. However, it is not always necessary to use a single glass material. A portion of the projection lens system may be made of a different glass material such as $CaF_2$, for example. In that occasion, through similar correcting operations, errors can be corrected or reduced into a tolerable range.

Next, a device manufacturing method according to an embodiment of the present invention, for producing devices by using a projection exposure apparatus according to any one of the preceding embodiments, will be explained.

Figure 5:
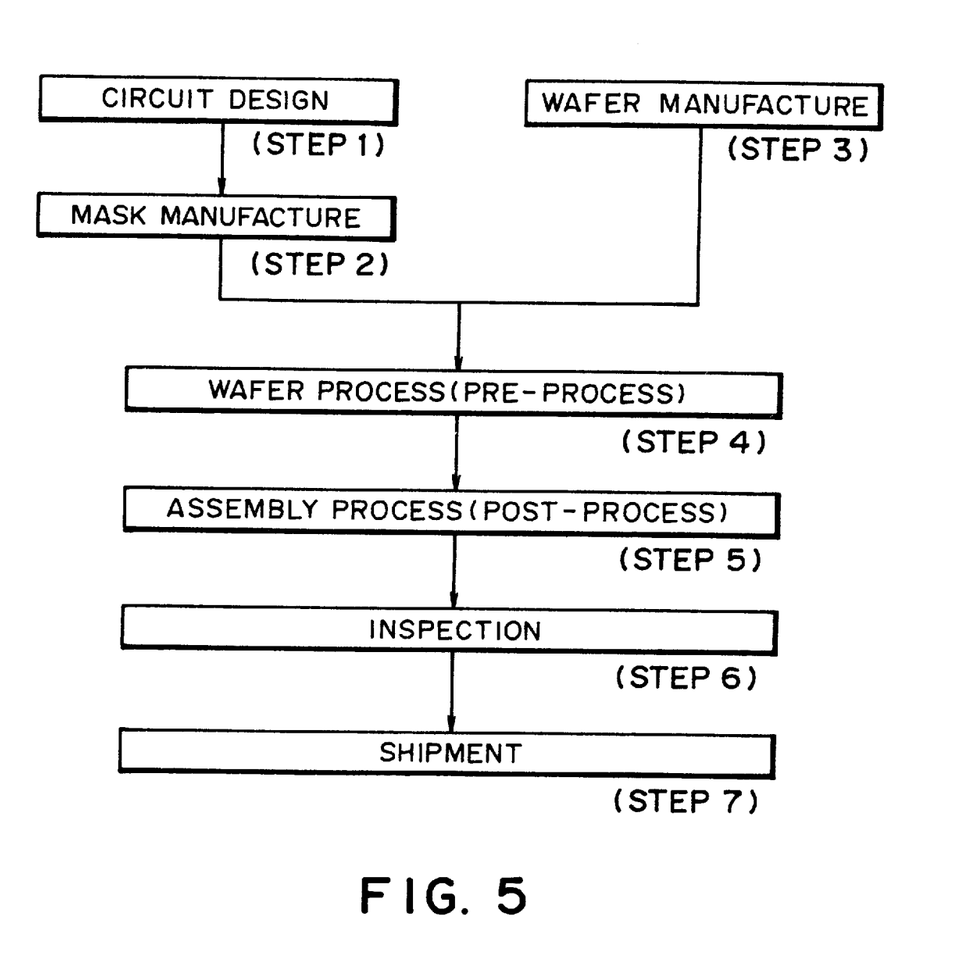
FIG. 5 is a flow chart of device manufacturing method according to an embodiment of the present invention.

FIG. 5 is a flow chart of the sequence of manufacturing a semiconductor device such as a semiconductor chip (e.g. an IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 6:
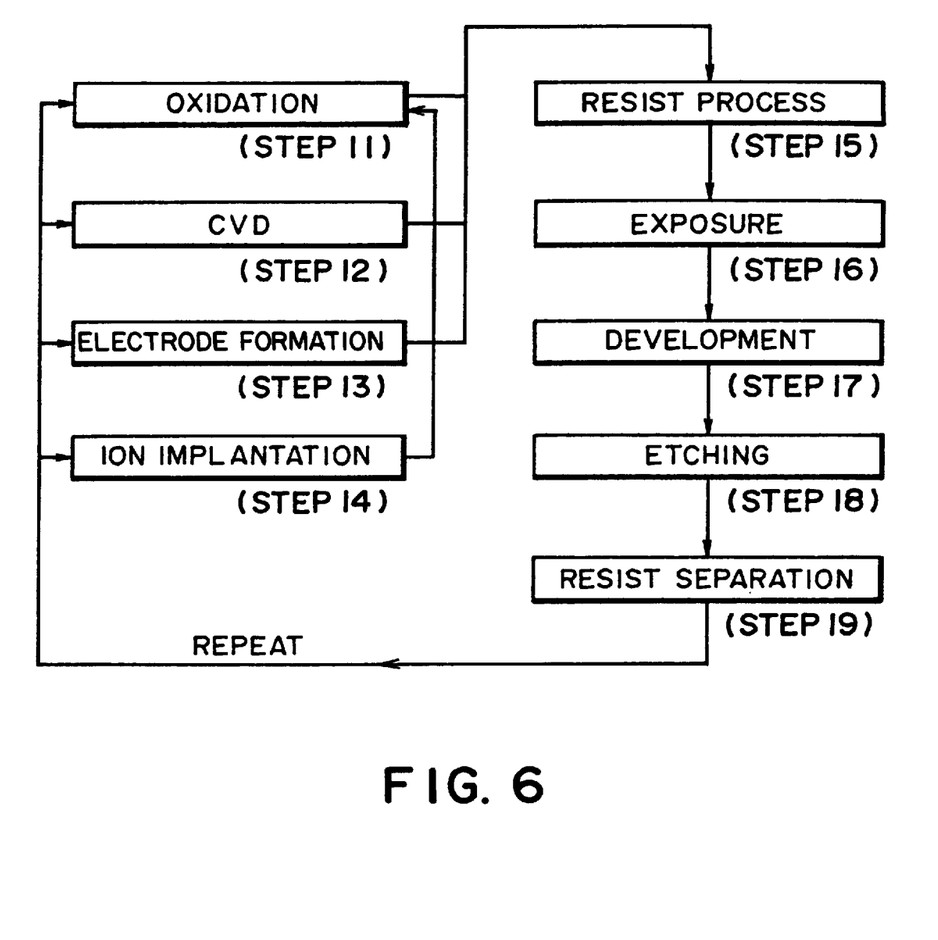
FIG. 6 is a flow chart showing details of a process in the flow of FIG. 5.

FIG. 6 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In accordance with the embodiments of the present invention described above, when a pattern of a reticle is projected onto a wafer through a projection optical system, a change in optical performance due to a daily pressure change or the pressure at the location where the apparatus is installed can be corrected satisfactorily by using pressure measuring means and an adjusting mechanism. Thus, the present invention provides a projection exposure apparatus and a device manufacturing method by which high optical performed is assured easily.

Particularly, in accordance with the embodiments described above: a pressure around a projection optical system is measured and an emission wavelength of light of an illumination system is changed in accordance with the amount of change in pressure. This enables exact correction of focus position, projection magnification, spherical aberration, comma, astigmatism, image surface curvature and distortion in the projection, by the projection optical system, of an image of a pattern formed on the first object.

Also, even if the image performance of the pattern image is degraded due to daily pressure change or a pressure change corresponding to a difference in land level of the location where the apparatus is installed, it is possible to correct the focus position error, projection magnification error, spherical aberration error comma error, astigmatism error, image surface curvature error and distortion error of the pattern image, satisfactorily.

Further, in IC manufacturing processes, reticles having respective circuit patterns corresponding to respective wafer processes are used to superposedly print these patterns on a wafer. By correcting an error in magnification caused between different processes or a projection magnification error between different apparatuses when different processes are performed by using different apparatuses, it is possible to maintain good matching precision for registration of a reticle and a wafer.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:

illumination means for supplying illumination light;

a projection optical system for projecting a pattern of a first object onto a second object in cooperation with the illumination light, said projection optical system having a refraction optical element;

changing means for changing a wavelength of the illumination light;

detecting means for detecting a change in pressure around said projection optical system;

control means for controlling said changing means on the basis of an output of said detecting means so as to compensate a change in ratio of refractive index between an atmosphere and said refraction optical element due to a change in pressure; and correcting means for correcting a change in optical characteristic of said projection optical system, due to a factor other than the pressure change, without use of said changing means.

2. An apparatus according to claim 1, wherein said illumination means supplies laser light as said illumination light.

3. An apparatus according to claim 2, wherein the laser light comprises deep ultraviolet light and wherein said projection optical system includes a lens made of $SiO_2$.

4. An apparatus according to claim 3, wherein said projection optical system includes a lens made of $CaF_2$.

5. An apparatus according to claim 3, wherein said illumination means includes an excimer laser which produces the laser light, wherein said excimer laser has a resonator with a mirror and a wavelength selecting element, and wherein said changing means includes actuating means for changing one of said wavelength selecting element of said resonator and tilt of said mirror of said resonator.

6. An apparatus according to claim 5, wherein said wavelength selecting element comprises an etalon.

7. An apparatus according to claim 5, wherein said wavelength selecting element comprises a diffraction grating.

8. An apparatus according to claim 5, wherein said wavelength selecting element comprises a prism.

9. An apparatus according to claim 5, wherein said excimer laser comprises a KrF laser.

10. An apparatus according to claim 5, wherein said correcting means comprises driving means for moving the first object in a direction of an optical axis of said projection optical system, and a position detector for detecting the position of the first object with respect to the direction of the optical axis.

11. An apparatus according to claim 5, wherein said correcting means comprises driving means for moving a lens of said projection optical system in a direction of an optical axis of said projection optical system, and a position detector for detecting the position of a surface of said lens with respect to the direction of the optical axis.

12. An apparatus according to claim 5, wherein said correcting means comprises driving means for moving the second object in a direction of an optical axis of said projection optical system, and a position detector for detecting the position of a surface of the second object with respect to the direction of the optical axis.

13. An apparatus according to claim 5, wherein said correcting means comprises actuating means for changing a pressure in a space between lenses of said projection optical system, and a pressure detector for detecting a pressure in the space.

14. A device manufacturing method including a step of projecting and transferring a device pattern of a mask onto a substrate by using a projection exposure apparatus as recited in any one of claims 1–13.

15. A projection exposure apparatus, comprising:

illumination means for supplying illumination light;

a projection optical system for projecting a pattern of a first object onto a second object in cooperation with the illumination light, said projection optical system having a refraction optical element;

changing means for changing a wavelength of the illumination light;

detecting means for detecting a change in pressure around said projection optical system;

control means for controlling said changing means on the basis of an output of said detecting means so as to maintain a constant ratio of refractive index between an atmosphere and said refraction optical element irrespective of a change in pressure; and correcting means for correcting a change in optical characteristic of said projection optical system, due to a factor other than the pressure change, without use of said changing means.

16. An apparatus according to claim 15, wherein said illumination means supplies laser light as said illumination light.

17. An apparatus according to claim 16, wherein the laser light comprises deep ultraviolet light and wherein said projection optical system includes a lens made of $SiO_2$.

18. An apparatus according to claim 17, wherein said projection optical system includes a lens made of $CaF_2$.

19. An apparatus according to claim 17, wherein said illumination means includes an excimer laser which produces the laser light, wherein said excimer laser has a resonator with a mirror and a wavelength selecting element, and wherein said changing means includes actuating means for changing one of said wavelength selecting element of said resonator and tilt of said mirror of said resonator.

20. An apparatus according to claim 19, wherein said wavelength selecting element comprises an etalon.

21. An apparatus according to claim 19, wherein said wavelength selecting element comprises a diffraction grating.

22. An apparatus according to claim 19, wherein said wavelength selecting element comprises a prism.

23. An apparatus according to claim 19, wherein said excimer laser comprises a KrF laser.

24. An apparatus according to claim 19, wherein said correcting means comprises driving means for moving the first object in a direction of an optical axis of said projection optical system, and a position detector for detecting the position of the first object with respect to the direction of the optical axis.

25. An apparatus according to claim 19, wherein said correcting means comprises driving means for moving a lens of said projection optical system in a direction of an optical axis of said projection optical system, and a position detector for detecting the position of a surface of said lens with respect to the direction of the optical axis.

26. An apparatus according to claim 19, wherein said correcting means comprises driving means for moving the second object in a direction of an optical axis of said projection optical system, and a position detector for detecting the position of a surface of the second object with respect to the direction of the optical axis.

27. An apparatus according to claim 19, wherein said correcting means comprises actuating means for changing a pressure in a space between lenses of said projection optical system, and a pressure detector for detecting a pressure in the space.

28. A device manufacturing method including a step of projecting and transferring a device pattern of a mask onto a substrate by using a projection exposure apparatus as recited in any one of claims 15–27.

* * * * *

UNITED STATES PATENT AND TRADEMARK OFFICE
CERTIFICATE OF CORRECTION

PATENT NO. : 5,838,426

DATED : November 17, 1998

INVENTORS : HIROHIKO SHINONAGA, ET AL.

It is certified that error appears in the above-identified patent and that said Letters Patent is hereby corrected as shown below:

ON THE COVER PAGE

At item [54], in the title, "AND," should read --AND--.

At item [56], under "U.S. PATENT DOCUMENTS", insert --5,638,168  6/1997  Kubota et al.--.

IN THE DISCLOSURE

COLUMN 1:

line 1, "AND," should read --AND--.

COLUMN 5:

line 57, "Signal" should read --Signals--.

COLUMN 6:

line 63, "Tale 1" should read --Table 1--.

UNITED STATES PATENT AND TRADEMARK OFFICE
CERTIFICATE OF CORRECTION

PATENT NO. : 5,838,426

DATED : November 17, 1998

INVENTORS : HIROHIKO SHINONAGA, ET AL.

It is certified that error appears in the above-identified patent and that said Letters Patent is hereby corrected as shown below:

COLUMN 8:

lines 64-67, "$\Delta\lambda' = \Delta f_\lambda^{-1}\{\Delta f_X(\Delta X)\}$
$\Delta\lambda' = \Delta SA_\lambda^{-1}\{\Delta SA_X(\Delta X)\}$
$\Delta\lambda' = \Delta CM_\lambda^{-1}\{\Delta CM_X(\Delta X)\}$" should read -- $\Delta\lambda' = -\Delta f_\lambda^{-1}\{\Delta f_X(\Delta X)\}$
$\Delta\lambda' = -\Delta SA_\lambda^{-1}\{\Delta SA_X(\Delta X)\}$
$\Delta\lambda' = -\Delta CM_\lambda^{-1}\{\Delta CM_X(\Delta X)\}$ --.

COLUMN 9:

lines 1-6, "$\Delta\lambda' = \Delta AS_\lambda^{-1}\{\Delta AS_X(\Delta X)\}$
$\Delta\lambda' = \Delta M_{80}^{-1}\{\Delta M_X(\Delta X)\}$
$\Delta\lambda' = \Delta S_\lambda^{-1}\{\Delta S_X(\Delta X)\}$
$\Delta\lambda' = \Delta Y_\lambda^{-1}\{\Delta Y_X(\Delta X)\}$" should read -- $\Delta\lambda' = -\Delta AS_\lambda^{-1}\{\Delta AS_X(\Delta X)\}$
$\Delta\lambda' = -\Delta M_\lambda^{-1}\{\Delta M_X(\Delta X)\}$
$\Delta\lambda' = -\Delta S_\lambda^{-1}\{\Delta S_X(\Delta X)\}$
$\Delta\lambda' = -\Delta Y_\lambda^{-1}\{\Delta Y_X(\Delta X)\}$ --; and

UNITED STATES PATENT AND TRADEMARK OFFICE
CERTIFICATE OF CORRECTION

PATENT NO. : 5,838,426

DATED : November 17, 1998

INVENTORS : HIROHIKO SHINONAGA, ET AL.

It is certified that error appears in the above-identified patent and that said Letters Patent is hereby corrected as shown below:

COLUMN 9 (cont'd):

line 8, "$\Delta AS_{80}$," should read --$\Delta AS_{\lambda}$,--.

COLUMN 11:

line 50, "that" should read --those--.

COLUMN 12:

line 55, "performed" should read --performance--.

UNITED STATES PATENT AND TRADEMARK OFFICE
CERTIFICATE OF CORRECTION

PATENT NO. : 5,838,426

DATED : November 17, 1998

INVENTORS : HIROHIKO SHINONAGA, ET AL.

It is certified that error appears in the above-identified patent and that said Letters Patent is hereby corrected as shown below:

COLUMN 13:

```
    line 4, "error" (second occurrence) should read
--error,--.
```

Signed and Sealed this

Tenth Day of August, 1999

Attest:

Q. TODD DICKINSON

Attesting Officer

Acting Commissioner of Patents and Trademarks